(12) United States Patent
Nakano et al.

(10) Patent No.: US 7,009,195 B2
(45) Date of Patent: Mar. 7, 2006

(54) PHOTOCONDUCTIVE SWITCH MODULE

(75) Inventors: Junichi Nakano, Hachioji (JP); Hiroshi Miyajima, Hachioji (JP); Daisuke Matsuo, Hachioji (JP); Kenzi Murakami, Hino (JP); Mitsuchika Saito, Kawasaki (JP); You Kondoh, Yamato (JP); Tsutomu Takenaka, Hachioji (JP); Yasuhisa Kaneko, Kawasaki (JP)

(73) Assignee: Olympus Corporation, Tokyo (JP)

( * ) Notice: Subject to any disclaimer, the term of this patent is extended or adjusted under 35 U.S.C. 154(b) by 294 days.

(21) Appl. No.: 10/616,258

(22) Filed: Jul. 9, 2003

(65) Prior Publication Data

US 2004/0046106 A1   Mar. 11, 2004

(30) Foreign Application Priority Data

Jul. 9, 2002   (JP)   ............................. 2002-200209

(51) Int. Cl.
*G02B 27/00*   (2006.01)
(52) U.S. Cl. .................... 250/551; 250/239; 257/82
(58) Field of Classification Search ............... 250/551, 250/214 LS, 214 SW, 227.11, 227.24, 239; 257/80–84, 431–435
See application file for complete search history.

(56) References Cited

U.S. PATENT DOCUMENTS

| | | | |
|---|---|---|---|
| 5,990,475 A | * | 11/1999 | Alegi .......................... 250/239 |
| 6,252,221 B1 | | 6/2001 | Kaneko et al. |
| 6,407,401 B1 | | 6/2002 | Kondoh et al. |
| 6,759,668 B1 | * | 7/2004 | Matsuo et al. .............. 250/551 |

* cited by examiner

*Primary Examiner*—Seung C. Sohn
(74) *Attorney, Agent, or Firm*—Scully, Scott, Murphy & Presser

(57) ABSTRACT

The present invention is directed to a photoconductive switch module. The photoconductive switch module comprises a first substrate having light-emitting elements, and a second substrate having photoconductive switch elements, whose number is equal to that of the light-emitting elements. The light-emitting elements face the photoconductive switch elements, so that the photoconductive switch elements are turned on/off in accordance with lighting/extinction of the light-emitting elements. The photoconductive switch module further comprises a third substrate arranged between the first substrate and the second substrate. The third substrate has through holes, whose number is equal to that of the light-emitting elements. Each through hole is positioned between a light-emitting element and a photoconductive switch element facing each other. Drive light emitted from each light-emitting element travels to the photoconductive switch element via the through hole.

15 Claims, 4 Drawing Sheets

PHOTOCONDUCTIVE SWITCH MODULE

CROSS-REFERENCE TO RELATED APPLICATIONS

This application is based upon and claims the benefit of priority from the prior Japanese Patent Application No. 2002-200209, filed Jul. 9, 2002, the entire contents of which are incorporated herein by reference.

BACKGROUND OF THE INVENTION

1. Field of the Invention

The present invention relates to a photoconductive switch module, which is realized by a combination of light-emitting elements and photoconductive switch elements, and more particularly to a small photoconductive switch module in which photoconductive switch elements are integrated.

2. Description of the Related Art

U.S. Pat. No. 6,407,401B1 discloses a small high-frequency/high-performance photoconductive relay. The photoconductive relay, which realizes a small high-frequency switch, includes a photoconductive switch element, whose resistance varies according to the intensity of incident light, and a light-emitting element, which emits light to illuminate the photoconductive switch element, the photoconductive switch element and the light-emitting element being closely positioned to face each other. This photoconductive relay provides a minimum unit of a switch that can take the on state and the off state.

The photoconductive switch element is an element which is important to realize a photoconductive relay (photoconductive switch), and an example of such an element is disclosed in, e.g., U.S. Pat. No. 6,252,221B1.

In order to realize a sophisticated switch module, photoconductive switch elements must be used to constitute a switch circuit.

The circuit must be designed in such a manner that the layout becomes very compact, i.e., the wiring becomes short in order to obtain the good performance in a high frequency. That is, the photoconductive switch elements must be arranged in close proximity to each other.

BRIEF SUMMARY OF THE INVENTION

The present invention is directed to a photoconductive switch module. The photoconductive switch module comprises a first substrate having light-emitting elements, and a second substrate having photoconductive switch elements, whose number is equal to that of the light-emitting elements. The light-emitting elements face the photoconductive switch elements, so that the photoconductive switch elements are turned on/off in accordance with lighting/extinction of the light-emitting elements. The photoconductive switch module further comprises a third substrate arranged between the first substrate and the second substrate. The third substrate has through holes, whose number is equal to that of the light-emitting elements. Each through hole is positioned between a light-emitting element and a photoconductive switch element facing each other. Drive light emitted from each light-emitting element travels to the photoconductive switch element via the through hole.

Advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Preferred embodiments according to the present invention will be described hereinafter with reference to the accompanying drawings.

First Embodiment

A photoconductive switch module according to the first embodiment will now be described with reference to FIGS. 1 to 5.

Figure 1:
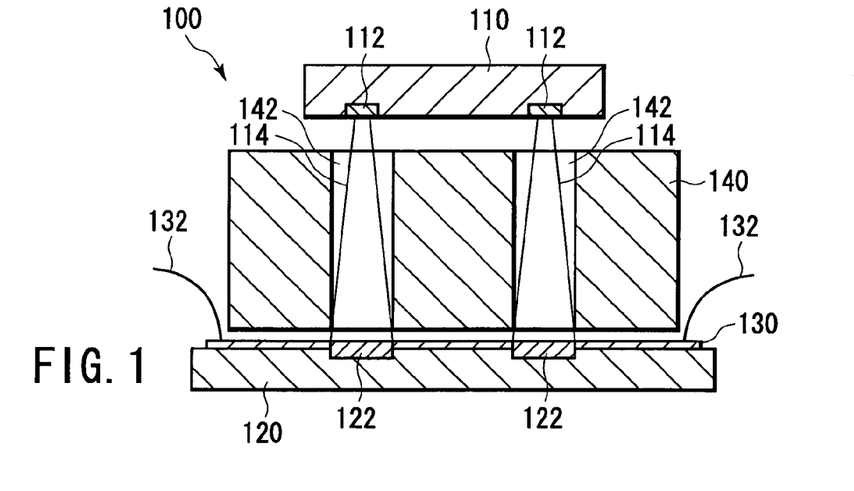
FIG. 1 shows a cross section of a photoconductive switch module according to a first embodiment of the present invention.

As shown in FIG. 1, a photoconductive switch module 100 has a light-emitting element substrate 110 as a first substrate having light-emitting elements 112, a switch element substrate 120 as a second substrate having photoconductive switch elements 122, whose number is equal to that of the light-emitting elements 112, and a spacer 140 as a third substrate arranged between the light-emitting element substrate 110 and the switch element substrate 120.

The light-emitting elements 112 and the photoconductive switch elements 122 are arranged to face each other. The spacer 140 has through holes 142 whose number is equal to that of the light-emitting elements 112, i.e., equal to that of the photoconductive switch elements 122. Each through hole 142, which has a size substantially equal to a size of the photoconductive switch element 122, e.g., a diameter of 20–100 μm, is arranged between the light-emitting element 112 and the photoconductive switch element 122 facing each other. That is, the light-emitting element 112 and the photoconductive switch element 122 face each other via the through hole 142. In other words, the light-emitting element 112 and the photoconductive switch element 122 facing each other are optically coupled with each other via the through hole 142.

Further, the switch element substrate 120 has a circuit wiring 130 connected to the photoconductive switch elements 122 on the side facing the spacer 140. The photoconductive switch elements 122 and the circuit wiring 130 constitute an electric circuit suitable for an application of the photoconductive switch module 100. The circuit wiring 130 is connected with an external electric circuit through wires 132.

The light-emitting element 112 is, but is not limited to, e.g., a VCSEL (vertical cavity surface emitting laser). The photoconductive switch element 122, which is a photoconductive switch disclosed in, e.g., U.S. Pat. No. 6,252,221B1, is turned on/off in accordance with lighting/extinction of the light-emitting element 112. The document is incorporated in the present specification by reference.

In this specification, a term "photoconductive switch element" means a minimum unit that performs the electrical on/off operation of a line connected to this element by a change in resistance in response to illumination, and a term "photoconductive switch module" means a switch circuit constituted by a combination of the photoconductive switch elements.

The photoconductive switch element 122 has a characteristic that, when it is not illuminated, has a high resistance, and while being illuminated, the resistance is reduced in accordance with the intensity of the incident light.

Therefore, the photoconductive switch element 122 demonstrates a high resistance when the corresponding light-emitting element 112 is off to take the off state (i.e., insulation state or open state).

When the light-emitting element 112 is lighted, drive light 114 emitted from the light-emitting element travels through the through hole 142 to illuminate the photoconductive switch element 122. As a result, the photoconductive switch element 122 has the resistance lowered, and is switched to the on state (conductive state).

When the light-emitting element 112 is switched off, the resistance of the photoconductive switch element 122 is increased to an initial value, and the photoconductive switch element 122 returns to the off state (insulation state, open state).

Figure 2:
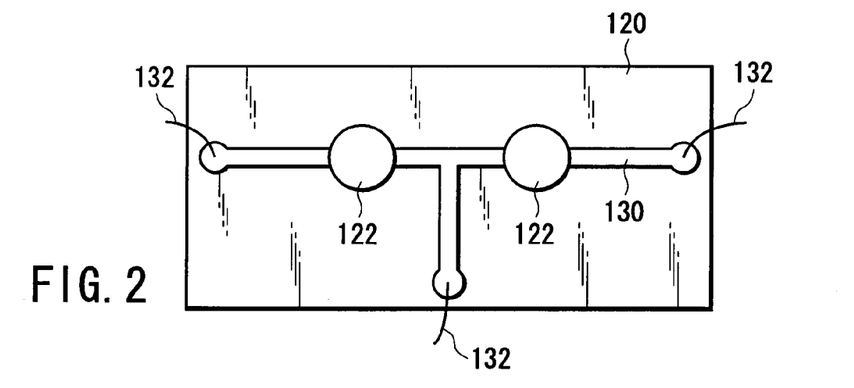
FIG. 2 shows one layout of the photoconductive switch elements and a circuit wiring illustrated in FIG. 1.
Figure 3:
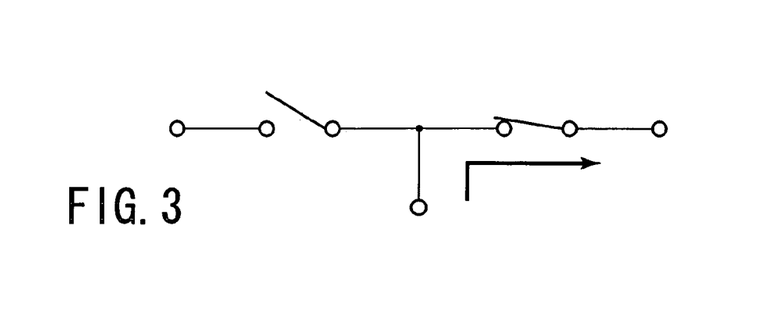
FIG. 3 shows an equivalent circuit of the photoconductive switch elements and the circuit wiring according to the layout of FIG. 2.

For example, the photoconductive switch elements 122 and the circuit wiring 130 are laid out as shown in FIG. 2. In FIG. 2, the switch element substrate 120 has a size of approximately 0.5 mm×1.0 mm, and the distance between the photoconductive switch elements 122 is approximately 200–500 μm. As apparent from FIG. 3 showing its equivalent circuit, the photoconductive switch elements 122 and the circuit wiring 130 constitute a single-pole double-throw switch circuit (1:2 switch circuit). Of course, the photoconductive switch element 122 that is illuminated with the drive light is turned on, and the photoconductive switch element 122 that is not illuminated with the drive light is turned off.

Figure 4:
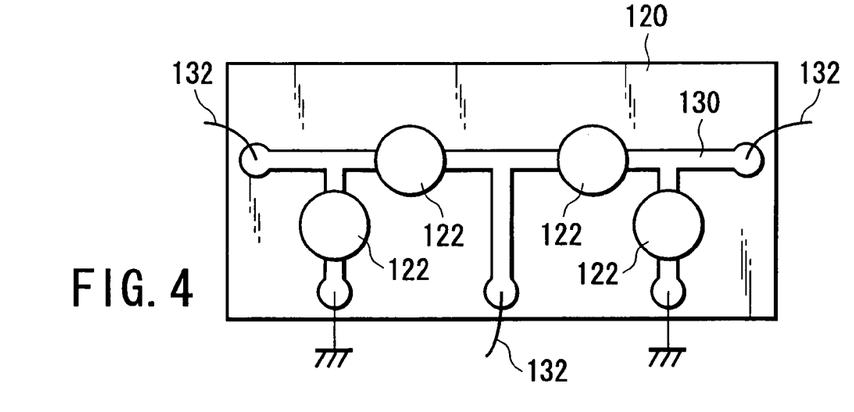
FIG. 4 shows a further preferable layout of the photoconductive switch elements and the circuit wiring depicted in FIG. 1.
Figure 5:
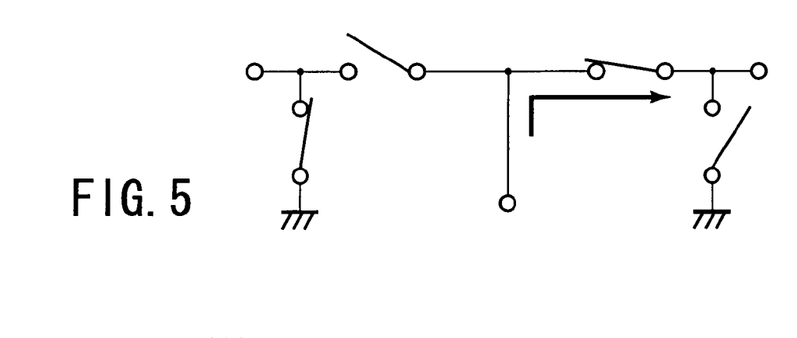
FIG. 5 shows an equivalent circuit of the photoconductive switch elements and the circuit wiring according to the layout of FIG. 4.

More preferably, the photoconductive switch elements 122 and the circuit wiring 130 are laid out as shown in FIG. 4. As apparent from FIG. 5 showing its equivalent circuit, the photoconductive switch elements 122 and the circuit wiring 130 constitute a single-pole double-throw switch circuit, which avoids the influence of parasitic capacitances of the switch elements and whose performance is further improved.

Since the photoconductive switch element has the characteristic that the intensity of the drive light is substantially in inverse proportion to the resistance, if the leakage light of the drive light that is directed to the photoconductive switch element to be turned on enters the photoconductive switch element to be turned off, the photoconductive switch element to be turned off, whose resistance is lowered, fails to take the complete off state.

A beam of light projected from the light-emitting element such as a VCSEL is diverging. Further, as apparent from FIGS. 2 and 4, when one of the photoconductive switch elements adjacent to each other is turned on, the other one is turned off in many cases.

Therefore, in the photoconductive switch module constituted without providing the spacer 140 having the through holes 142, the light directed to the photoconductive switch element 122 to be turned on easily leaks into the photoconductive switch element 122 to be turned off. As a result, the resistance of the photoconductive switch element 122 to be turned off is lowered, resulting in deterioration in the transmission performance (insertion loss or return loss) and the isolation performance as the switch circuit.

As shown in FIG. 1, however, in the photoconductive switch module 100 according to this embodiment that includes the spacer 140 having the through holes 142 between the light-emitting element substrate 110 and the switch element substrate 120, the beam of drive light 114 projected from the light-emitting element 112 is diverging, but its spread is restricted in the corresponding through hole 142. That is, the drive light 114 from the light-emitting element 112 is guided within the through hole 142 to travel to the photoconductive switch element 122 facing the light-emitting element 112.

In other words, the spacer 140 having the through holes 142 constitutes a light isolator that isolates the light between a pair of the light-emitting element 112 and the photoconductive switch element 122 from the light between another pair of the light-emitting element 112 and the photoconductive switch element 122.

As a result, generation of the leakage light or incidence on another photoconductive switch element can be suppressed. That is, the resistance of the photoconductive switch element 122 to be turned off is kept sufficiently high.

Therefore, although the photoconductive switch module 100 according to this embodiment has a compact circuit design, degradation of the performance due to the leakage light is suppressed.

That is, the photoconductive switch module 100 according to this embodiment is sophisticated since the circuit is constituted by using the photoconductive switch elements is small, since the photoconductive switch elements are arranged in close proximity to each other, and has the good performance with suppression of generation of the undesired leakage light.

Second Embodiment

A photoconductive switch module according to a second embodiment will now be described hereinafter with reference to FIGS. 6 to 8. In the drawings, like reference numerals denote members equivalent to those in the photoconductive switch module according to the first embodiment. In the following, detailed explanation of those members will be eliminated in order to avoid tautological description.

Figure 6:
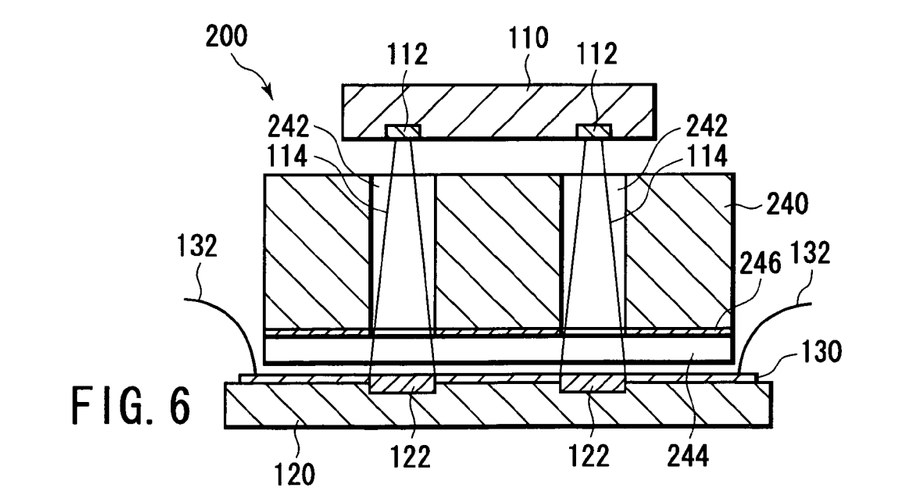
FIG. 6 shows a cross section of a photoconductive switch module according to a second embodiment of the present invention.

As shown in FIG. 6, a photoconductive switch module 200 has a light-emitting element substrate 110 having light-emitting elements 112, a switch element substrate 120 having photoconductive switch elements 122, whose number is equal to that of the light-emitting elements 112, and a spacer 240 arranged between the light-emitting element substrate 110 and the switch element substrate 120.

The spacer 240 has through holes 242 arranged between the light-emitting elements 112 and the photoconductive switch elements 122 and a groove, i.e., a concave portion 244 formed on the side facing the switch element substrate 120. The concave portion 244 extends along a circuit wiring 130 provided on the switch element substrate 120. Therefore, the concave portion 244 cuts across the through holes 242, and each through hole 242 terminates on the bottom surface of the concave portion 244 as shown in FIGS. 6 to 8.

Figure 7:
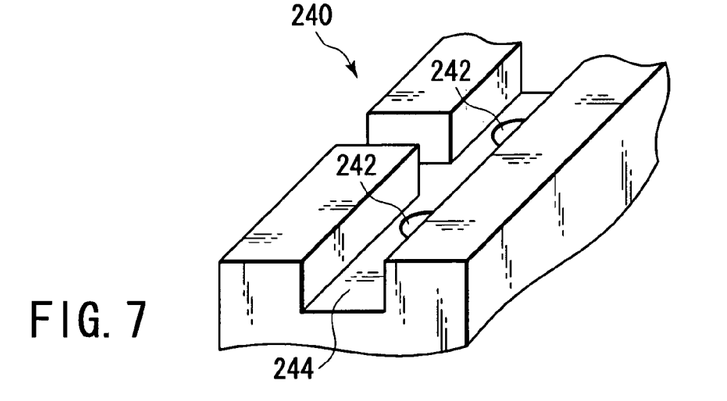
FIG. 7 is a perspective view showing the side of a spacer facing a switch element substrate depicted in FIG. 6.
Figure 8:
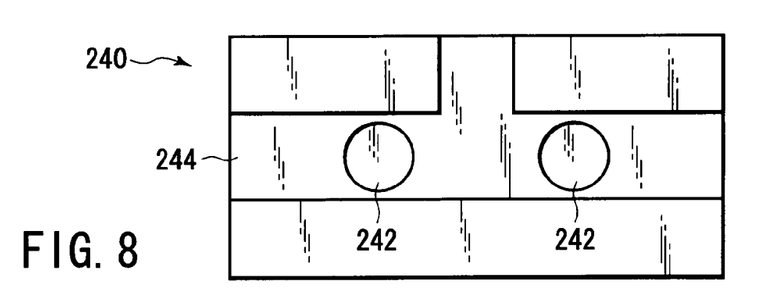
FIG. 8 is a front view showing the side of the spacer facing the switch element substrate depicted in FIG. 6.

For example, the circuit wiring 130 extends in the T form as shown in FIG. 2, and the concave portion 244 extends in the T form in accordance with this as shown in FIGS. 7 and 8.

The spacer 240 has conductivity at least near the surface of the concave portion 244. That is, the spacer 240 has a conductive part at least near the concave portion 244.

Therefore, the spacer 240 has a conductive film 246 provided on the surface of the inner side of the concave portion 244 as shown in, e.g., FIG. 6. The conductive film 246 may be formed on the entire lower surface of the spacer 240 as well as the surface of the inner side of the concave portion 244. Alternatively, the spacer 240 itself may be formed of a conductive material in place of having the conductive film 246. The conductive film 246 does not have to be exposed, and it may be covered with a very thin insulating film, e.g., an oxide film although not shown.

The concave portion 244 has, e.g., a width of approximately 300 μm and a depth of approximately 100 μm. The conductive film 246 is constituted by, e.g., a metal film having sufficiently high conductivity such as aluminum (Al). Preferably, the conductive film 246 is connected to a GND potential portion of the switch element substrate 120 by a non-illustrated conductive member (conductive adhesive or bump).

The switch operation in the photoconductive switch module 200 according to this embodiment is completely the same as that of the photoconductive switch module 100 according to the first embodiment, and its explanation will be eliminated here.

In the photoconductive switch module 200 according to this embodiment, the conductive part of the spacer 240 near the surface of the concave portion 244, e.g., the conductive film 246 extends along the circuit wiring 130 of the switch element substrate 120, and functions as an electromagnetic shield with respect to the circuit wiring 130. As a result, the high-frequency performance of the transmission line in the photoconductive switch module can be assured.

In other words, the photoconductive switch module 200 according to this embodiment has a structure that the function of the electromagnetic shield is added to the conductive switch module 100 according to the first embodiment. Therefore, the photoconductive switch module 200 has the good performance in high frequency in addition to the advantages of the photoconductive switch module 100 according to the first embodiment.

Third Embodiment

A photoconductive switch module according to a third embodiment will now be described hereinafter with reference to FIGS. 9 to 11. In the drawings, like reference numerals denote members equivalent to those in the photoconductive switch module according to the first embodiment. In the following, detailed explanation of these members will be eliminated in order to avoid tautological description.

Figure 9:
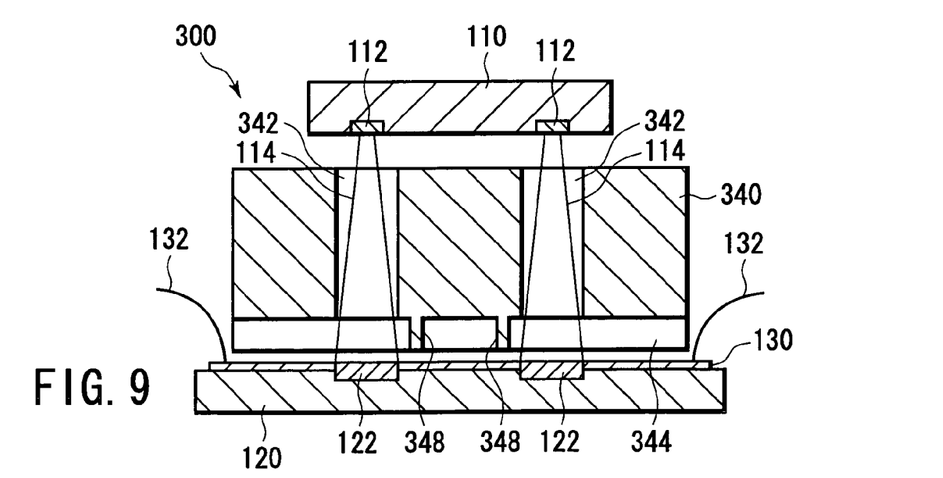
FIG. 9 shows a cross section of a photoconductive switch module according to a third embodiment of the present invention.

As shown in FIG. 9, a photoconductive switch module 300 has a light-emitting element substrate 110 having light-emitting elements 112, a switch element substrate 120 having photoconductive switch elements 122, whose number is equal to that of the light-emitting elements 112, and a spacer 340 arranged between the light-emitting element substrate 110 and the switch element substrate 120.

The spacer 340 has through holes 342 arranged between the light-emitting elements 112 and the photoconductive switch elements 122, and a groove 344, i.e., a concave portion 344 formed on the side facing the switch element substrate 120. The concave portion 344 extends along the circuit wiring 130 provided to the switch element substrate 120. Therefore, each through hole 342 terminates on the bottom surface of the concave portion 344 as shown in FIGS. 9 to 11. For example, the concave portion 244 extends in the T shape like the second embodiment.

The spacer 340 further has convex portions 348 protruding from the bottom surface of the concave portion 344. Each convex portion 348 extends cutting across the concave portion 344 and has a height equal to the depth of the concave portion 344. Therefore, the concave portion 344 is divided into three portions 344a, 344b and 344c by the two convex portions 348 as shown in FIG. 11.

Such convex portions 348 are readily formed without applying to a base material of the spacer 340 the processing to form the concave portion 344. That is, the spacer 340 having such convex portions 348 is relatively readily manufactured.

The two adjacent photoconductive switch elements 122 are reversely turned on/off in many cases like the circuit configuration shown in FIGS. 2 to 4, for example. Each convex portion 348 is positioned between the photoconductive switch elements 122 that are reversely turned on/off in this manner.

The switch operation of the photoconductive switch module 300 according to this embodiment is carried out in completely the same way as the photoconductive switch module 100 according to the first embodiment.

In the photoconductive switch module 300 according to this embodiment, of the light emitted from the light-emitting element 112 corresponding to the photoconductive switch element 122 to be turned on, the majority of the light directed toward the adjacent photoconductive switch element 122 while being diffusely reflected on the inner side of the concave portion 344 is reflected or absorbed by the convex portions 348. That is, the undesired leakage light existing on the inner side of the concave portion 344 is greatly attenuated by the convex portions 348. Therefore, the leakage light that reaches the photoconductive switch element 122 to be turned off can be sufficiently attenuated.

Like the second embodiment, the spacer 340 preferably has a conductive part at least near the surface of the concave portion 344, i.e., the portions 344a, 344b and 344c. This conductive part is constituted by, e.g., a conductive film provided on the surface of the inner side of the concave portion 344 and connected to a GND potential portion of the switch element substrate 120 like the second embodiment.

The spacer 340 and the switch element substrate 120 are arranged with a slight gap therebetween in order to avoid the electrical contact between the convex portions 348 and the circuit wiring 130. Furthermore, in order to fix and mount the switch element substrate 120 and the spacer 340, a space for a conductive adhesive or bump is required, and hence a gap exists between the convex portions 348 and the switch element substrate 120.

Although the light that enters into this gap exists to a certain extent, since this light is attenuated in the narrow gap between the convex portions 348 and the switch element substrate 120 during multiple reflection, the intensity of the leakage light which enters the adjacent photoconductive switch element 122 to be turned off is sufficiently small.

As apparent from the above description, in view of attenuation of the leakage light, it is preferable to set a thickness of each convex portion 348 (dimension in the direction along which the circuit wiring 130 or the concave portion 344 extends) as large as possible and set the gap between the convex portion 348 and the switch element substrate 120 smaller.

However, since each convex portion 348 affects the concave portion structure for the electromagnetic shield, it is preferable to set the thickness of the convex portion 348 as small as possible and set the gap between each convex portion 348 and the switch element substrate 120 larger in view of the circuit performance.

Considering the balance of the thickness and the gap, it is good to set the thickness of the convex portion 348 to approximately 10–100 $\mu$m, preferably, approximately 20–50 $\mu$m and the gap between each convex portion 348 and the photoconductive switch element 122 to approximately 5–100 $\mu$m, preferably, approximately 10–50 $\mu$m.

The photoconductive switch module 300 according to this embodiment has the convex portions 348 protruding from the bottom surface of the concave portion 344 between the photoconductive switch elements 122 that are reversely turned on/off, and the undesired leakage light directed toward the photoconductive switch element 122 to be turned off is greatly attenuated by the convex portions 348. Therefore, the leakage light that reaches the photoconductive switch element 122 to be turned off can be sufficiently attenuated.

Figure 10:
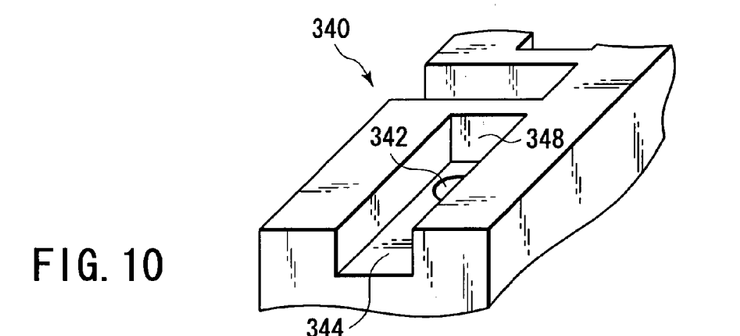
FIG. 10 is a perspective view showing the side of a spacer facing a switch element substrate depicted in FIG. 9.
Figure 11:
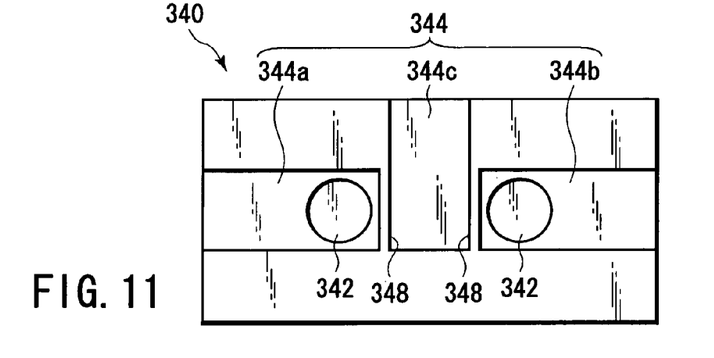
FIG. 11 is a front view showing the side of the spacer facing the switch element substrate depicted in FIG. 9.

In the spacer 340 shown in FIGS. 9 to 11, although each convex portion 348 has a height equal to a depth of the concave portion 344, the height of the convex portion 348 does not have to be equal to the depth of the concave portion 344. For example, like a spacer 340A shown in FIG. 12, the height of the convex portion 348 may be set smaller than the depth of the concave portion 344. That is, in the photoconductive switch module 300 according to this embodiment, the convex portion 348 may have a height that is equal to or smaller than the depth of the concave portion 344.

Figure 12:
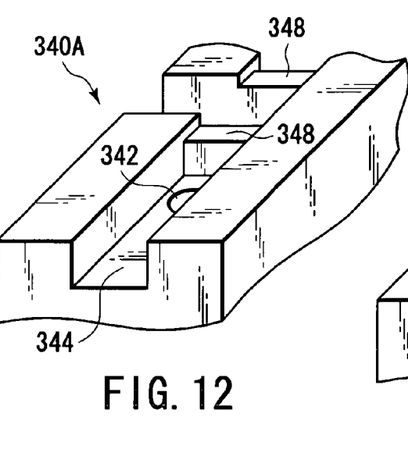
FIG. 12 is a perspective view showing the lower surface side of another spacer having a convex portion whose height is different from that of the spacer depicted in FIGS. 9 to 11.

Although such a spacer 340A has a demerit that its processing is slightly complicated, the contact between each convex portion 348 and the circuit wiring 130 can be assuredly avoided, and hence it has a merit that the difficulty of connection/mounting of the spacer 340A and the switch element substrate 120 can be lowered.

Fourth Embodiment

This embodiment is directed to another spacer, which may be applied in place of the spacer 340 in the photoconductive switch module according to the third embodiment. The spacer according to this embodiment will now be described with reference to FIG. 13.

Figure 13:
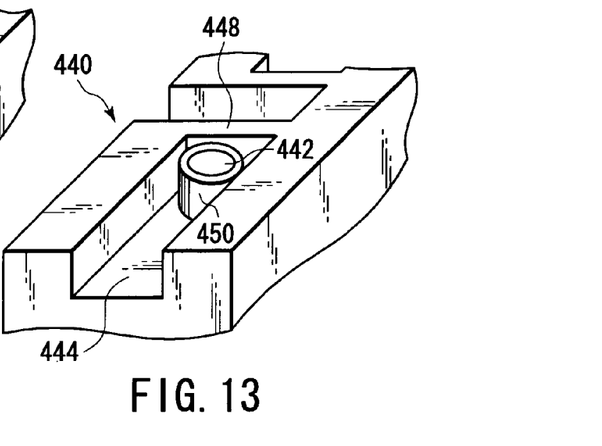
FIG. 13 is a perspective view showing the side of a spacer facing a switch element substrate according to a fourth embodiment of the present invention which can be applied in place of the spacer of the photoconductive switch module according to the third embodiment depicted in FIGS. 9 to 11.

Like the third embodiment, a spacer 440 has through holes 442, a groove, i.e., a concave portion 444 formed on the side facing the switch element substrate 120, and a plate-like convex portion 448 protruding from the bottom surface of the concave portion 444. The convex portion 448 extends cutting across the convex portion 444 and has a height equal to a depth of the concave portion 444.

The spacer 440 has a tubular convex portion 450 protruding from the bottom surface of the concave portion 444. Although the tubular convex portion 450 is not restricted to one in the drawing, it has, e.g., a cylindrical shape and surrounds a through hole 442. Therefore, the through hole 442 terminates on the end surface of the tubular convex portion 450. The tubular convex portion 450 has a height equal to a depth of the concave portion 444.

The plate-like convex portion 448 and the tubular convex portion 450 are formed by eliminating the processing to form the concave portion 444 with respect to a base material of the spacer 440.

In the photoconductive switch module using the spacer 440 according to this embodiment, the end of each through hole 442 is arranged in the close proximity to the photoconductive switch element. That is, the through hole 442 is defined by the tubular convex portion 450 and extends to the vicinity of the photoconductive switch element. Therefore, drive light from the light-emitting element is contained in the through hole 442 immediately before reaching the photoconductive element. Moreover, the light exiting from the through hole 442 hardly spreads, and reaches the photoconductive switch element.

As a result, the intensity of the drive light that reaches the photoconductive switch element 122 to be turned on is further increased as compared with the photoconductive switch module according to the third embodiment. That is, the utilization efficiency of the drive light is further improved. Additionally, the leakage light that reaches the photoconductive switch element 122 to be turned off is further attenuated.

Therefore, the photoconductive switch module using the spacer 440 according to this embodiment has a structure that the utilization efficiency of the drive light and generation of the undesired leakage light are improved in the photoconductive switch module according to the third embodiment.

The photoconductive switch module using the spacer 440 according to this embodiment has the further improved good performance as compared with the photoconductive switch module according to the third embodiment.

Although the spacer 440 shown in FIG. 13 has the convex portion 448 and the tubular portion 450, the plate-like convex portion 448 may be eliminated if the tubular convex portion 450 alone can obtain the sufficient performance that satisfies the design requirement.

Although the embodiments according to the present invention have been described above with reference to the accompanying drawings, the present invention is not restricted to these embodiments, and various modifications or variations may be carried out without departing from the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A photoconductive switch module comprising:
   a first substrate having light-emitting elements;
   a second substrate having photoconductive switch elements, whose number is equal to that of the light-emitting elements, the light-emitting elements and the photoconductive switch elements being arranged to face each other, the photoconductive switch elements being turned on/off in accordance with lighting/extinction of the light-emitting elements; and
   a third substrate arranged between the first substrate and the second substrate, the third substrate having through holes, whose number is equal to that of the light-emitting elements, each through hole being arranged between the light-emitting element and the photoconductive switch element facing each other, drive light emitted from each light-emitting element traveling to the photoconductive switch element via the through hole;
   wherein the second substrate has a circuit wiring connected to the photoconductive switch elements on the side facing the third substrate, the third substrate has a concave portion extending along the circuit wiring, such that the through holes terminate on the bottom surface of the concave portion, and the third substrate has conductivity at least in the vicinity of the surface of the concave portion and the circuit wiring and the concave portion are arranged to face each other.

2. The photoconductive switch module according to claim 1, wherein the third substrate further has a convex portion protruding from the bottom surface of the concave portion, and the convex portion has a height equal to or smaller than a depth of the concave portion.

3. The photoconductive switch module according to claim 2, wherein the convex portion is positioned between the photoconductive switch elements to be reversely turned on/off.

4. The photoconductive switch module according to claim 2, wherein the convex portion and the second substrate are spaced with a gap equal to or smaller than 100 μm, and the convex portion has a thickness (dimension in a direction along which the concave portion extends) equal to or smaller than 100 μm.

5. The photoconductive switch module according to claim 2, wherein a height of the convex portion is equal to a depth of the concave portion.

6. The photoconductive switch module according to claim 2, wherein a height of the convex portion is smaller than a depth of the concave portion.

7. The photoconductive switch module according to claim 2, wherein the convex portion surrounds the through hole.

8. A photoconductive switch module comprising:
   a first substrate having light-emitting elements;
   a second substrate having photoconductive switch elements, whose number is equal to that of the light-emitting elements, the light-emitting elements and the photoconductive switch elements being arranged to face each other, the photoconductive switch elements being turned on/off in accordance with lighting/extinction of the light-emitting elements; and
   light isolation means for isolating the light between a pair of the light-emitting element and the photoconductive switch element from the light between another pair of the light-emitting element and the photoconductive switch element;
   wherein the light isolation means comprises a third substrate arranged between the first substrate and the second substrate, the third substrate has through holes, whose number is equal to that of the light-emitting elements, each through hole is arranged between the light-emitting element and the photoconductive switch element facing each other, and drive light emitted from the light-emitting element travels to the photoconductive switch element via the through hole; and
   wherein the second substrate has a circuit wiring connected to the photoconductive switch elements on the side facing the third substrate, and the photoconductive switch module further comprises electromagnetic shield means for the circuit wiring, the electromagnetic shield means being disposed on the third substrate on the side facing the second substrate and arranged to face the circuit wiring.

9. The photoconductive switch module according to claim 8, wherein the third substrate has a concave portion extending along the circuit wiring, such that the through holes terminate on the bottom surface of the concave portion, the third substrate has conductivity at least in the vicinity of the surface of the concave portion, and the conductive part in the vicinity of the surface of the concave portion constitutes the electromagnetic shield means.

10. A photoconductive switch module comprising:
    a first substrate having light-emitting elements;
    a second substrate having photoconductive switch elements, whose number is equal to that of the light-emitting elements, the light-emitting elements and the photoconductive switch elements being arranged to face each other, the photoconductive switch elements being turned on/off in accordance with lighting/extinction of the light-emitting elements; and
    a third substrate arranged between the first substrate and the second substrate, the third substrate having through holes, whose number is equal to that of the light-emitting elements, each through hole being arranged between the light-emitting element and the photoconductive switch element facing each other, drive light emitted from each light-emitting element traveling to the photoconductive switch element via the through hole;
    wherein the second substrate has a circuit wiring connected to the photoconductive switch elements on the side facing the third substrate, the third substrate has a concave portion extending along the circuit wiring, such that the through holes terminate on the bottom surface of the concave portion, and the third substrate has conductivity at least in the vicinity of the surface of the concave portion and the third substrate further has a convex portion protruding from the bottom surface of the concave portion, and the convex portion has a height equal to or smaller than a depth of the concave portion.

11. The photoconductive switch module according to claim 10, wherein the convex portion is positioned between the photoconductive switch elements to be reversely turned on/off.

12. The photoconductive switch module according to claim 10, wherein the convex portion and the second substrate are spaced with a gap equal to or smaller than 100 μm, and the convex portion has a thickness (dimension in a direction along which the concave portion extends) equal to or smaller than 100 μm.

13. The photoconductive switch module according to claim 10, wherein a height of the convex portion is equal to a depth of the concave portion.

14. The photoconductive switch module according to claim 10, wherein a height of the convex portion is smaller than a depth of the concave portion.

15. The photoconductive switch module according to claim 10, wherein the convex portion surrounds the through hole.

* * * * *

UNITED STATES PATENT AND TRADEMARK OFFICE
CERTIFICATE OF CORRECTION

| | |
|---|---|
| PATENT NO. | : 7,009,195 B2 |
| APPLICATION NO. | : 10/616258 |
| DATED | : March 7, 2006 |
| INVENTOR(S) | : Junichi Nakano et al. |

It is certified that error appears in the above-identified patent and that said Letters Patent is hereby corrected as shown below:

Title Page:   "(73) Assignee: Olympus Corporation, Tokyo (JP)"

should read

--(73) Assignees:   Olympus Corporation, Tokyo (JP)

Agilent Technologies, Inc., Palo Alto (CA)--

Signed and Sealed this

Fifth Day of October, 2010

David J. Kappos
*Director of the United States Patent and Trademark Office*